(12) United States Patent
Charpin-Nicolle

(10) Patent No.: US 9,117,702 B2
(45) Date of Patent: Aug. 25, 2015

(54) METHOD FOR MANUFACTURING A DOUBLE-GATE ELECTRONIC MEMORY CELL AND ASSOCIATED MEMORY CELL

(71) Applicant: COMMISSARIAT A L'ENERGIE ATOMIQUE ET AUX ENERGIES ALTERNATIVES, Paris (FR)

(72) Inventor: Christelle Charpin-Nicolle, Fontanil-Cornillon (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 14/323,781

(22) Filed: Jul. 3, 2014

(65) Prior Publication Data
US 2015/0008509 A1    Jan. 8, 2015

(30) Foreign Application Priority Data

Jul. 5, 2013   (FR) ...................................... 13 56619

(51) Int. Cl.
  *H01L 27/115*   (2006.01)
  *H01L 29/94*    (2006.01)
  (Continued)

(52) U.S. Cl.
  CPC .... *H01L 27/11563* (2013.01); *H01L 21/28282* (2013.01); *H01L 29/42344* (2013.01); *H01L 29/66833* (2013.01); *H01L 29/7831* (2013.01); *H01L 29/792* (2013.01)

(58) Field of Classification Search
  CPC ................. H01L 27/11563; H01L 29/7831; H01L 29/792; H01L 29/66833; H01L 29/42344; H01L 21/28282
  USPC .......... 257/314, 315, 319, 324, 326, E27.081, 257/E27.103, E29.3, E29.309, E21.409, 257/E21.422, E21.679; 438/154, 283, 591, 438/592
  See application file for complete search history.

(56) References Cited

U.S. PATENT DOCUMENTS 5,768,192 A    6/1998  Eitan
7,130,223 B2  10/2006  Ishimaru et al.
(Continued)

FOREIGN PATENT DOCUMENTS

DE          102010037120         4/2011

OTHER PUBLICATIONS

Search Report and Written Opinion issued for French Patent Application No. 1356619, dated May 5, 2014.
(Continued)

*Primary Examiner* — Dao H Nguyen
(74) *Attorney, Agent, or Firm* — Pillsbury Winthrop Shaw Pittman LLP

(57) ABSTRACT

A method of manufacturing a double-gate electronic memory cell is presented. The cell includes a substrate; a first gate structure, with the first gate structure having a lateral flank; a stack including several layers and of which a layer is able to store electrical charges, the stack covering the lateral flank of the first gate structure and a portion of the substrate; and a second gate structure. The second gate structure includes a first portion formed from a first gate material; a second portion formed from a second gate material, with the first gate material able to be etched selectively in relation to the second gate material and with the second gate material able to be etched selectively in relation to the first gate material; a first zone of silicidation extending over the first portion of the second gate structure; and a second zone of silicidation extending over the second portion of the second gate structure.

10 Claims, 8 Drawing Sheets

(51) Int. Cl.
*H01L 29/66* (2006.01)
*H01L 21/28* (2006.01)
*H01L 29/423* (2006.01)
*H01L 29/792* (2006.01)
*H01L 29/78* (2006.01)

(56) References Cited

U.S. PATENT DOCUMENTS

| | | | |
|---|---|---|---|
| 2003/0198086 A1* | 10/2003 | Shukuri | 365/185.18 |
| 2004/0207025 A1 | 10/2004 | Chiba et al. | |
| 2010/0078706 A1 | 4/2010 | Matsuda | |
| 2011/0001179 A1 | 1/2011 | Yanagi et al. | |
| 2012/0068243 A1* | 3/2012 | Kawashima et al. | 257/315 |
| 2012/0299084 A1* | 11/2012 | Saito et al. | 257/324 |
| 2014/0239367 A1* | 8/2014 | Saito et al. | 257/319 |
| 2015/0035034 A1* | 2/2015 | Winstead et al. | 257/314 |
| 2015/0054048 A1* | 2/2015 | Loiko et al. | 257/316 |

OTHER PUBLICATIONS

Kianian, S., et al., "A Novel 3 Volts-Only, Small Sector Erase, High Density Flash E²PROM," 1994 Symposium on VLSI Technology Digest of Technical Papers, 1994, pp. 71-72.

Masoero, L., et al., "Scalability of split-gate charge trap memories down to 20nm for low-power embedded memories," IEEE International Electron Devices Meeting (IEDM), 2011, pp. 215-218.

* cited by examiner

METHOD FOR MANUFACTURING A DOUBLE-GATE ELECTRONIC MEMORY CELL AND ASSOCIATED MEMORY CELL

CROSS-REFERENCE TO RELATED APPLICATIONS

This application claims priority to French Patent Application No. 1356619, filed Jul. 5, 2013, the entire content of which is incorporated herein by reference in its entirety.

FIELD

This invention relates to the field of methods for manufacturing double-gate non-volatile electronic memory cells, and more particularly that of methods for manufacturing double-gate Flash memories (memory floating-gate and selection gate) having a particularly interesting application in the field of on-board electronics. The invention also relates to the field of memory cells obtained by these methods.

BACKGROUND

There are several types of non-volatile memories, i.e. memories that retain memorized information in the absence of electrical power, able to be written and/or erased electrically:

EPROMs ("Erasable Programmable Read Only Memories"), of which the content can be written electrically, but which must be subjected to UV radiation to erase the memorized information;

EEPROMs ("Electrically Erasable Programmable ROMs"), of which the content can be written and erased electrically, but which require, in order to create them, semiconductor surfaces that are more substantial than memories of the EPROM type, and which therefore are more expensive to create.

Non-volatile memories also exist, called Flash memories, which do not have the disadvantages of EPROM or EEPROM memories mentioned hereinabove. Indeed, a Flash memory is formed from a plurality of memory cells that can be programmed electrically individually, a large number of cells, called a block, sector or page, being able to be erased simultaneously and electrically. The Flash memories combine both the advantage of EPROM memories in terms of integration density and the advantage of EEPROM memories in terms of electrical erasing.

In addition, the durability and the low electrical consumption of Flash memories make them interesting for many applications: digital photo devices, mobile telephones, printers, personal assistants, portable computers, or portable audio playing and recording devices, USB keys, etc. In addition, Flash memories do not have any mechanical elements, which provide them with rather high resistance to impacts.

Most Flash memories are of the "stand-alone" type and have large storage capacities, generally greater than 1 Gb, and are dedicated to mass storage applications.

However, there are also Flash memories referred to as on-board ("embedded memories") of which the creation is integrated into a method of the CMOS type and which has a growing interest, for example in the fields of the automobile or microcontrollers, for the storage of data or codes. These on-board Flash memories are created on a chip that further comprises CMOS devices intended to carry out logic functions other than memorization of data. These on-board Flash memories are generally made for storage capacities that are lower than those of the "stand-alone" type memories, with their capacities able to vary generally from a few bytes to a few Mb. The intended characteristics of on-board Flash memories are a low cost to produce them, excellent reliability (in particular at high temperature), low electrical consumption, or a high programming speed, with these characteristics being according to the application to which they are intended.

Most Flash memories comprise a structure of the MOS transistor type (gate, source, drain and channel) comprising a site for storing electrical charges, called a floating gate, formed for example from a layer of polysilicon arranged between two layers of oxide, and arranged between the electrically conductive gate material and the channel of the transistor. Memorization is carried out by applying on the conductive material a voltage greater than the threshold voltage, for example between 15 V and 20 V, which makes it possible to store the information in the form of charges trapped in the floating gate.

However, such memories have disadvantages that limit the reduction of their dimensions. Indeed, a reduction in the thickness of the tunnel oxide (oxide arranged between the channel and the layer of polysilicon) causes an increase in the SILC ("Stress Induced Leakage Current"). However, the prolonged use of such a memory (repetition of writing—erasing cycles) generates defects in the tunnel oxide which will assist the conduction of charges and degrade the retaining of the charges in the floating gate, which causes problems in the case of a substantial SILC. In practice, it is therefore difficult to reduce the thickness of the tunnel oxide of these memories to less than 8 nm without the SILC becoming a critical phenomenon for the memorization. In addition, by reducing the dimensions of such a memory cell, the cross-coupling between the floating gates of two adjacent cells of the same memory becomes substantial and can therefore degrade the reliability of the memory.

For these reasons, memories of the MONOS (Metal Oxide Nitride Oxide Silicon) type, also called NROM memories, have been proposed to replace the floating-gate memories made of polysilicon. Document U.S. Pat. No. 5,768,192 describes such memories wherein the electrical charges are stored in traps formed in a floating gate comprised of nitride and arranged between two layers of oxide. In such a layer of nitride, the traps are insulated from one another. As such, an electron stored in one of the traps remains physically located in this trap, which makes these memories much more "resistant" to the defects in the tunnel oxide, and therefore less impacted by an increase in the SILC. Indeed, in the presence of a defect in the tunnel oxide, the layer of memorization, i.e. the layer of nitride, loses only the electrons located in the close surroundings of the defect, with the other trapped electrons not being affected by this defect. These memories therefore have better reliability. It is as such possible to have a tunnel oxide with a thickness less than 8 nm, and therefore to reduce the required programming voltages. In addition, due to the low thickness of the nitride to form the memory layer, the coupling between two adjacent memory cells is greatly reduced in relation to floating-gate cells made of polysilicon. Finally, the structure of a memory of the NROM type is also adapted to carry out on-board memories due to the simplicity of the method for integrating these memories.

The document of S. Kianian and al., "A novel 3 volts-only, small sector erase, high density flash $E^2PROM$" (Technical Digest of VLSI Technology, 1994, p. 71) describes another type of memory, called "split-gate" memory, which comprises within the same memory cell a memory transistor and a selection transistor (or control transistor) formed on a single active zone. Such a double-gate memory cell is generally programmed via source side injection, a mechanism that precisely requires the presence of a selection transistor placed alongside the memory transistor, and which makes it possible to increase the programming speed while still reducing the consumption in relation to a memory of the NROM type.

In order to benefit from the advantages of each structure, split-gate and NROM, document US2004/207025A1 proposes another type of double-gate memory that combines the structure of a memory of the NROM type with a split-gate architecture. One of the difficulties in carrying out these memories relates to controlling the position of the gates (gate of the control transistor and gate of the memory transistor) in relation to one another.

Indeed, these gates are carried out by two successive photolithographies, with the misalignment of the second gate in relation to the first gate setting the length of the second gate. Poor control of the relative positions of the two gates therefore results in poor control of the electrical characteristics of the second transistor, and therefore potentially poor performance of the memory. Consequently, a very precise control of the position of the gates is required during the creation of this type of memory.

In order to overcome this aligning constraint, document U.S. Pat. No. 7,130,223B2 proposes to carry out a double-gate memory that combines the structure of a memory of the NROM type with a split-gate architecture and wherein the gate of the memory transistor, i.e. the gate comprising the data memorization layer, is carried out in the form of a lateral spacer of the gate of the control transistor, arranged against one of the two lateral flanks of the gate of the control transistor. Such a structure makes it possible to precisely control the position and the dimension of the gate of the memory transistor in relation to the gate of the control transistor because, due to the fact that the gate of the memory transistor is carried out in the form of a lateral spacer, the latter is therefore self-aligned in relation to the gate of the control transistor.

Such a structure is shown in FIG. 1 which diagrammatically shows a double-gate memory 1 that combines the structure of a memory of the NROM type with a split-gate architecture wherein the gate of the memory transistor is carried out in the form of a lateral spacer of the gate of the control transistor. The memory 1 comprises an active zone 2 made in a semiconductor material and comprising a channel 3 arranged between a drain extension region 4 and a source extension region 5. The memory 1 further comprises a selection transistor gate 6 on top of a first portion $3_1$ of the channel 3 and a memory transistor gate 7 arranged against the lateral flank of the gate of the selection transistor 6.

This memory transistor gate 7 comprises in particular:
a stack 10 of layers of which at least one of said layers is able to store electrical charges. The layer able to store electrical charges of said stack of layers can be arranged between two layers of dielectric material of said stack. The stack 10 can be for example of the ONO (oxide-nitride-oxide) type;
a conductive gate zone 11 of the memory transistor made of polysilicon having a substantially rounded lateral flank 15;
layers 12, 13 of thin spacers located on the rounded portion of the conductive zone 11, for example made of high thermal oxide (HTO) (layer 13) and of $Si_3N_4$ nitride (layer 12). These layers of thin spacers are also found on the opposite portion of the selection transistor.

The stack 10 makes it possible to contribute to forming the gate of the memory transistor 7 and to contribute to insulating from one another the gate 6 of the selection transistor and the gate 7 of the memory transistor.

However, with such a structure, it is very difficult to then carry out an electrical contact on the gate of the memory transistor 7 in light of the small dimensions of this gate in the form of a lateral spacer. This carrying out of an electrical contact is for example illustrated by the silicidation zone 14 located at the top of the rounded lateral flank 15. It is observed that the zone allowing the silicidation is relatively reduced. This difficulty is further accentuated by the fact that the flanks obtained by the standard methods are rather of triangular shape; it is indeed very difficult to obtain by direct etching a rounded shape that makes it possible to obtain a sufficient silicidation surface. Such an architecture 16 is shown in FIG. 2. The memory 16 is identical to the memory 1 but has a conductive zone 17 of triangular shape whereon the silicidation zone 18 is even more limited than in the case of FIG. 1.

Moreover, the article "Scalability of split-gate charge memories down to 20 nm for low-power embedded memories" (Masoero and al.—Electron Devices Meeting (IEDM)—2011) demonstrated that reducing the memory gate length $L_{MG}$ (i.e. the length of the conductive gate zone 17 of the memory transistor closest to the channel 3 and measured according to the length of the channel 3—cf. FIG. 1) makes it possible to improve the electrical performance of the memory such as the programming window or the energy consumed. It is easily conceived that such a reduction in the gate length makes even more delicate the carrying out of a zone of substantial contact on the gate of the memory transistor.

SUMMARY

The method according to an aspect of the invention aims to overcome the disadvantages of prior art by proposing a method for manufacturing an electronic memory cell of the NROM type with a split-gate architecture making it possible to both obtain a surface for carrying out an electrical contact (i.e. silicidation zone) that is satisfactory while improving the electrical performance of said memory cell.

An embodiment of the invention therefore substantially relates to a method for manufacturing an electronic memory cell comprising:
  a substrate;
  a first gate structure deposited on the substrate;
  a stack comprising several layers and of which at least one of said layers is able to store electrical charges, said stack covering at least a lateral flank of the first gate structure and a portion of the substrate;
  a second gate structure insulated from the first gate structure and from the substrate by the stack;
the formation of the second gate structure comprising the following steps:
  depositing of a layer of a first material of the second gate structure, referred to as "first deposit", at least on the zone covered by the stack;
  depositing of a layer of a second material of the second gate structure, referred to as "second deposit", at least on the zone covered by the layer of first material, said second material able to be etched selectively in relation to said first material and said first material able to be etched selectively in relation to said second material;
  etching of the thickness of the layer of second material, referred to as "first etching", selectively in relation to the first material in such a way as to retain the portion of the second material laterally covering the first material;
  etching of the thickness of the layer of first material, referred to as "second etching", selectively in relation to the second material in such a way as to retain the portion of the first material laterally covering the stack, with the second gate structure comprising as such said portion of the first material laterally covering the stack, referred to as "first region" and at least one portion of said portion of the second material laterally covering the first material, referred to as "second region";

silicidation of a first zone extending over said first region of the second gate structure, and of a second zone extending over said second region of the second gate structure.

"Second material able to be etched selectively in relation to said first material" means that there is a first method of etching that primarily or exclusively affects the second material and which affects less or which does not affect the first material. "First material able to be etched selectively in relation to said second material" means that there is a second method of etching that primarily or exclusively affects the first material and which affects less or does not affect the second material.

Generally, "etching of the thickness of a layer of a material A selectively in relation to a material B" means that said etching primarily or exclusively affects said material A and affects less or does not affect said material B.

During the second etching, the second material protects the first material and contributes to the obtaining of a surface and of a volume of silicidation of the second gate structure that are more substantial than in prior art, as such allowing for a better carrying out of electrical contacts than in prior art. The second material, by protecting the first material to which it is placed against, also contributes to the obtaining of a lateral flank of the second gate structure that is substantially perpendicular to the plane of the substrate. Such a lateral flank substantially perpendicular to the plane of the substrate makes it possible, in relation to prior art, to better control the length of the second gate structure and therefore to better control the electrical performance of the memory such as the programming window or the energy consumed. It also makes it possible to provide a minimum thickness of the first material after etching and as such better control the placement, i.e. the width and the depth of the placement.

The first etching is beneficially anisotropic in order to retain the portion of the second material laterally covering the first material. Likewise, the second etching is beneficially anisotropic in order to retain the portion of the first material laterally covering the stack.

In addition to the main characteristics mentioned in the previous paragraph, the method for manufacturing a memory cell according to an embodiment of the invention can have one or several additional characteristics among the following, considered individually or according to the technically possible combinations.

The first residual material and the second residual material after the step of second etching each have an upper face. The substrate extending over a reference plane, "upper face" of a material means the surface of said material most distant from said reference plane of the substrate.

At the end of the step of second etching, the upper face of the first material and the upper face of the second material are generally unaligned and have a step difference. The step difference between two surfaces is defined in this document as being the difference in height between these two surfaces, with the height of a surface defined by the distance between this surface and the surface of the substrate along a normal direction to the reference plane of the substrate. According to the etching parameters chosen for this step of second etching, the step difference can be more or less substantial: if the second material is not at all etched, the step difference is maximal.

The method can beneficially comprise, after the step of second etching, a step of third etching of the second material selectively in relation to the first material, in such a way that at the end of this step of third etching the upper face of the second material and the upper face of the first material are aligned. The upper face of the first material and the upper face of the second material thus form a continuous surface, without a step difference. This as such contributes to the obtaining of a maximum surface and of a maximum volume of silicidation of the second gate structure, allowing for a better later carrying out of electrical contacts.

Before the deposit of the second material, the first material is beneficially cleaned beforehand with hydrofluoric acid HF. "The first material is beneficially cleaned beforehand with hydrofluoric acid HF" means the fact that the first material is placed into contact with a solution of hydrofluoric acid in order to remove the impurities that are potentially present on the first material and to provide a better surface condition.

During the step of first deposit, the deposit of the first material is beneficially a conformal deposit. Likewise, during the step of second deposit, the deposit of the second material is beneficially a conformal deposit. In this document, "conformal deposit" means a deposit that covers in a constant manner the relief whereon it is deposited. As such, this contributes to better control of the dimensioning and therefore the properties of the electronic memory cell obtained thanks to the method according to the invention. The deposit of the first material can as such beneficially be a chemical vapour deposition carried out at sub-atmospheric pressure.

The etching technique used during the step of first etching is beneficially a reactive ion etching technique or any other anisotropic etching technique. As such, this contributes to retaining, at the end of the step of first etching, the portion of the second material laterally covering the first material. The etching selectivity between the first material and the second material is not necessarily very high. It is entirely tolerable to begin to consume, during the first etching, the first material deposited. On the other hand, it is desirable to ensure that the first material is not fully etched. The etching can therefore be carried out either via time, or by using an end-of-attack detection system which makes it possible to control that the etching of the second material deposited is indeed complete.

Likewise, the etching technique used during the step of second etching is beneficially a reactive ion technique or any other anisotropic etching technique. As such, this contributes to retaining, at the end of the step of second etching, the portion of the first material laterally covering the stack and to controlling the lateral dimension, defining the memory gate length.

As a layer of second material of thickness $h_{2D}$ is deposited during the step of second deposit, the thickness $h_{2D}$ is beneficially such that: $h_{2D} \geq h_1/n$; $h_1$ being the thickness of the layer of first material deposited during the step of first deposit; the first material being etched n times faster than the second material. By knowing the relative etching speeds of the two materials and by optimising the relative thicknesses of these two materials, it is thus provided that the second material is not entirely consumed after etching of the first material. The thickness deposited of the second material will as such be sufficient and will make it possible to not etch the top of the first material during the step of second etching.

Beneficially, the thickness $h_{2D}$ is such that: $h_{2D} \geq h_1/n + h_1/5$. This retains as such, with good reliability, a sufficient thickness of the second material after the step of second etching.

The first material and the second material used are beneficially respectively polysilicon and polysilicon-germanium. The polysilicon can be etched selectively in relation to the polysilicon-germanium and the polysilicon-germanium can be etched selectively in relation to the polysilicon.

Generally, poly-SiGe$_x$ can be used as a second material, with x able to vary by a few percentage points at 50%. Also, the poly-SiGe$_x$ can be used as a first material and the polysilicon as a second material.

An embodiment of the invention also relates to an electronic memory cell comprising:
a substrate;
a first gate structure deposited on the substrate, the first gate structure having at least one lateral flank;
a stack comprising several layers and of which at least one of said layers is able to store electrical charges, said stack covering at least the lateral flank of the first gate structure and a portion of the substrate;
a second gate structure insulated from the first gate structure and from the substrate by the stack;
said second gate structure comprising:
a first region formed from a first gate material;
a second region formed from a second gate material, said first gate material able to be etched selectively in relation to said second gate material and said second gate material able to be etched selectively in relation to said first gate material;
a first zone of silicidation extending over said first region of the second gate structure;
a second zone of silicidation extending over said second region of the second gate structure.

In addition the characteristics mentioned in the preceding paragraph, the electronic memory cell according to an embodiment of the invention can present one or several complementary characteristics among the following, considered individually or according to all the possible technical combinations:

The first zone of silicidation and the second zone of silicidation form a continuous region of silicidation. "Continuous region" means the fact that the first zone of silicidation and the second zone of silicidation are aligned and do not have any step difference.

The first region of the second gate structure has a recess, wherein is located the second region of the second gate structure. "Recess" means a rupture in two regions of which one is set back in relation to the other.

Other characteristics and benefits of the method according to the invention shall appear when reading the following description, in reference to the annexed figures.

BRIEF DESCRIPTION OF THE FIGURES

The figures are presented for the purposes of information and in no way limit the invention.

For increased clarity, identical or similar elements are marked with identical reference signs in all of the figures.

DETAILED DESCRIPTION

Figure 1:
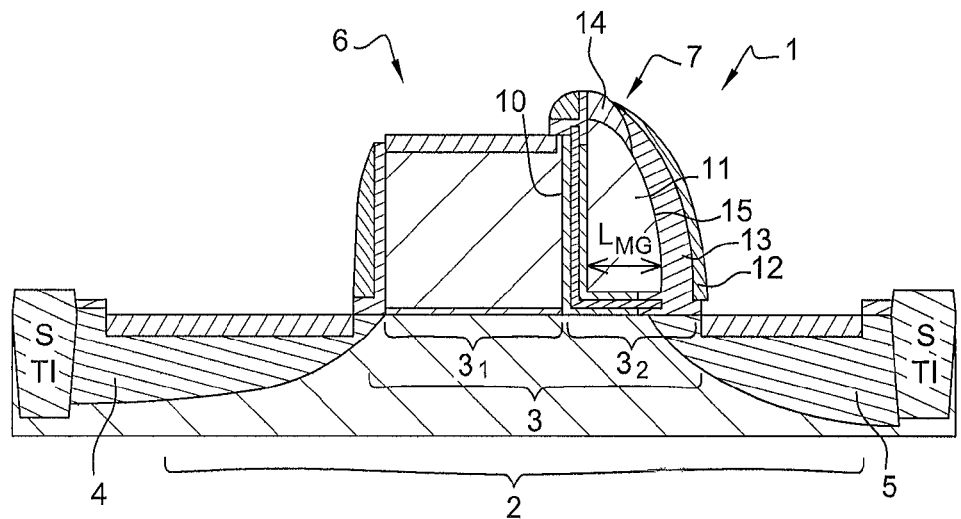
FIG. 1 diagrammatically shows a first example of a double-gate memory according to prior art that combines the structure of a memory of the NROM type with a split-gate architecture.
Figure 2:
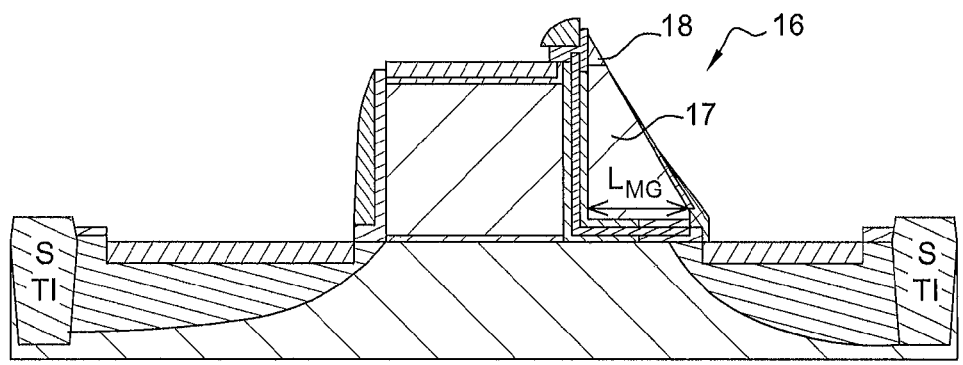
FIG. 2 diagrammatically shows a second example of a double-gate memory according to prior art that combines the structure of a memory of the NROM type with a split-gate architecture.
Figure 3:
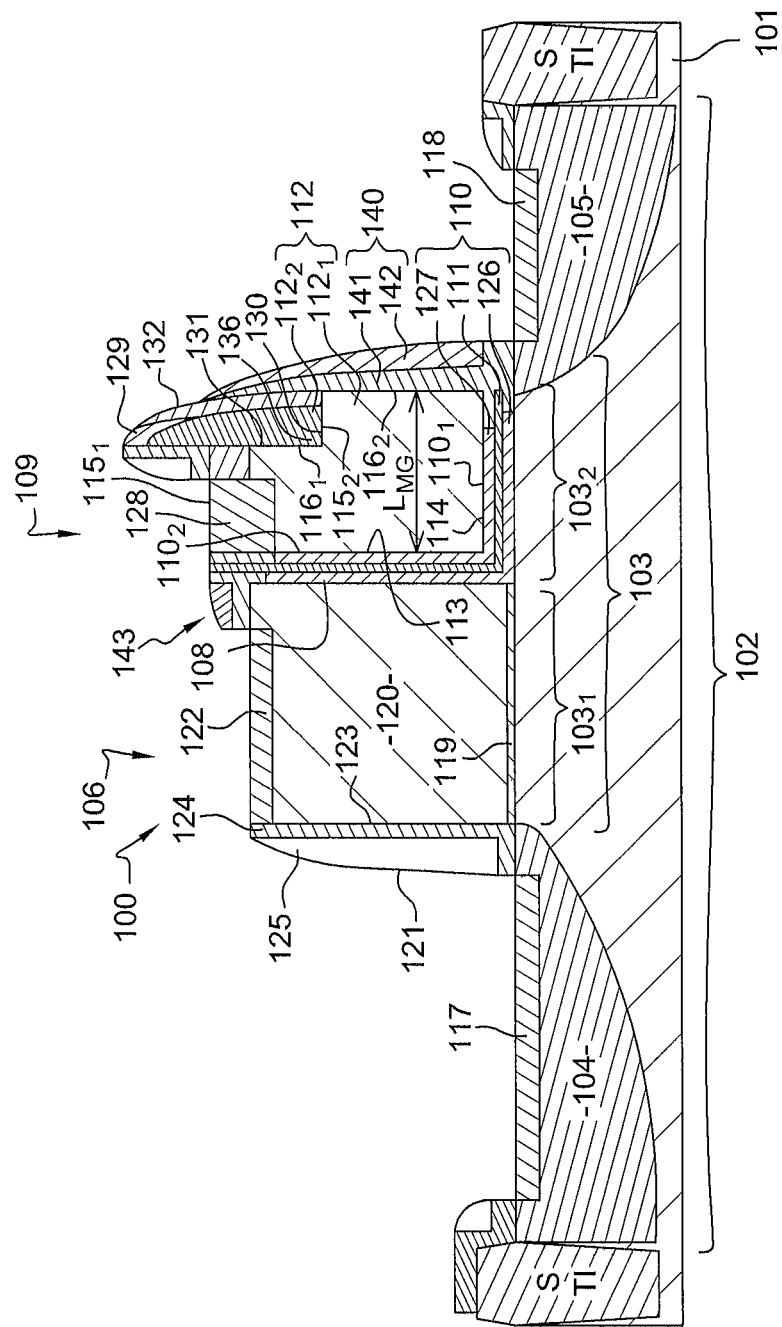
FIG. 3 shows an electronic memory cell of the NROM type with a split-gate architecture according to a first embodiment of the invention.

FIG. 3 shows an electronic memory cell 100 of the NROM type with a split-gate architecture according to a first embodiment of the invention.

The cell 100 comprises a substrate 101 whereon is formed an active zone 102 carried out in a semiconductor material and comprising a channel 103 arranged between a drain extension region 104 and a source extension region 105. In the case of the carrying out of a transistor of type n on a substrate 101 of type p, the drain 104 and source 105 extension regions are n+ doped. The drain extension region 104 further comprises a silicidation 117 on its upper face. The source extension region 105 further comprises a silicidation 118 on its upper face. The substrate 101 is a substrate with a semiconductor base such as silicon. The length of the channel is here shown along an axis Ox parallel to the plane of the substrate, with the Oy axis being shown perpendicular to the plane of the substrate.

In accordance with the principle of double-gate memories of the NROM type with split-gate architecture, the cell 100 comprises two gate structures arranged next to one another:
a first gate structure, referred to as selection transistor gate (or gate of the control transistor) 106;
a second gate structure, referred to as gate of the memory transistor 109 carried out in the form of a lateral spacer of the gate of the selection transistor 106.

The channel 103 is substantially separated into a first portion $103_1$ and a second portion $103_2$ side by side.

The gate of the selection transistor 106 is above the first portion $103_1$ while the gate of the memory transistor 109 is above the second portion $103_2$.

The gate of the selection transistor 106 comprises:
a dielectric gate layer 119 (for example made of SiO$_2$) in contact with the first portion $103_1$;
a conductive zone 120 of the gate 106 of the selection transistor (for example made of n+ doped polysilicon) covered by a silicidation 122.

The gate of the selection transistor 106 is insulated from the source 105 by the gate 109 of the memory transistor and from the drain 104 by a second lateral spacer 121.

More precisely, the conductive zone 120 of the gate 106 of the selection transistor has a first lateral wall 108 and a second lateral wall 123. The first lateral wall 108 is in contact with the gate 109 of the memory transistor. The second lateral wall 123 is entirely covered by the second lateral spacer 121.

The second lateral, spacer 121 is an insulating spacer extending over the entire lateral flank (drain side) and formed from a dielectric material, which can for example be a nitride or an oxide/nitride bilayer (for example, a layer 124 of SiO$_2$ HTO and a layer 125 of Si$_3$N$_4$).

The gate 109 of the memory transistor comprises a stack 110, for example a three-layer oxide-nitride-oxide stack (referred to as ONO) formed from a first layer 126 comprised of a dielectric material (for example made of SiO$_2$), of a second layer 111 made from a material able to store electrical charges (for example comprised of Si$_3$N$_4$) and of a third layer 127 comprised of a dielectric material (SiO$_2$, for example).

The ONO stack 110 has two zones:
a substantially horizontal first stack zone $110_1$ (i.e. with a surface parallel to the plane of the substrate 101) in contact with the second portion $103_2$;

a substantially vertical second stack zone $110_2$ (i.e. with a surface perpendicular to the plane of the substrate 101).

The gate of the memory transistor 109 includes said ONO stack 110 as well as a conductive gate zone of the memory transistor 112 (for example made of n+ doped polysilicon).

The conductive-gate zone 112 of the memory transistor comprises two regions:

a first region $112_1$ comprised of a first semiconductor material, for example of polysilicon, and comprising a recess 136;

a second region $112_2$ comprised of a second semiconductor material, for example a material with a polysilicon and germanium base (poly-SiGe$_x$), and filling in the recess 136 of the first region $112_1$. The first material is such that it can be etched selectively in relation to the second material and the second material is such that it can be etched selectively in relation to the first material, i.e. that if on the one hand the first material is etched with a certain etching technique and on the other hand the second material with the same etching technique, the etching speeds will be different.

The region $112_1$ of the conductive gate zone 112 of the memory transistor has:

a first lateral face 113 in contact with the second stack zone $110_2$ in such a way that the latter separates the lateral flank 108 of the gate of the selection transistor 106 and the first lateral face 113;

a lower face 114 substantially planar and parallel to the plane of the substrate 101; this lower face 114 is in contact with the first stack zone $110_1$ in such a way that the latter is inserted between the second portion $103_2$ of the channel 103 and the lower face 114 of the region $112_1$;

an upper face $115_1$ substantially planar and parallel to the plane of the substrate 101;

a second lateral face $116_1$ substantially planar and perpendicular to the plane of the substrate 101;

an intermediate face $115_2$ substantially planar and parallel to the plane of the substrate 101, the height of the intermediate face $115_2$ in relation to the plane of the substrate 101 being less than the height of the upper face $115_1$ in relation to the plane of the substrate 101. The intermediate face $115_2$ forms with the second lateral face $116_1$ the recess 136 of the region $112_1$;

a third lateral face $116_2$ substantially planar and perpendicular to the plane of the substrate 101.

The first lateral face 113 connects the lower face 114 to the first upper face $115_1$. The second lateral face $116_1$ connects the first upper face $115_1$ to the intermediate face $115_2$. The third lateral face $116_2$ connects the lower face 114 to the intermediate face $115_2$.

The conductive gate zone 112 of the memory transistor has a length $L_{MG}$, referred to as "memory gate length", which is the length of the region $112_1$ closest to the second portion $103_2$ of the channel 103, measured between the first lateral face 113 and the third lateral face $116_2$. As the third lateral face $116_2$ is substantially planar and perpendicular to the plane of the substrate 101, the distance between the first and third lateral faces 113 and $116_2$ remains constant from the intermediate face $115_2$ to the lower face 114, which allows for a good control of the length $L_{MG}$.

A first zone of silicidation 128 is moreover carried out on the first upper face $115_1$ by doping and silicidation.

The region $112_2$ of the conductive gate zone of the memory transistor has:

a lower face 130 substantially planar and parallel to the plane of the substrate 101; this lower face 130 is in contact with the intermediate face $115_2$ of the region $112_1$ of the conductive gate zone of the memory transistor;

a first lateral face 131 substantially planar and perpendicular to the plane of the substrate 101; this first lateral face has a zone in contact with the second lateral face $116_1$ of the region $112_1$ of the conductive gate zone of the memory transistor.

a curved upper face 132, connecting the lower face 130 to the first lateral face 131. This upper face 132 makes it possible, through a curved profile and therefore less abrupt, more rounded, to facilitate the later carrying out of an electrical contact.

A second zone of silicidation 129 is carried out on the curved upper face 132 by doping and silicidation. The upper face 132 of the region $112_2$ and the third lateral face $116_2$ of the region $112_1$ form a substantially continuous surface.

The cell 100 according to an embodiment of the invention therefore beneficially uses the two regions $112_1$ and $112_2$ of the conductive gate zone 112 of the memory transistor so that the total available surface in order to carry out the contact is more substantial.

An insulating spacer 140, formed from a dielectric material, which can for example be a nitride or an oxide/nitride bilayer (for example, a layer 141 of SiO$_2$ and a layer 142 of Si$_3$N$_4$), covers the entire substantially continuous surface formed by the upper face 132 of the region $112_2$ and the third lateral face $116_2$ of the region $112_1$, except the second zone of silicidation 129.

Also note that, in the example shown in FIG. 3, the lateral flank of the first zone of silicidation 128 is also covered with an insulating spacer 143. The insulating spacer 143 is on the side of the gate 106 of the selection transistor if the upper face $115_1$ is above the top of the gate 106 of the selection transistor, as in the example shown in FIG. 3. If the region $112_1$ was etched further and the upper face $115_1$ is below the top of the gate 106 of the selection transistor, the insulating spacer 143 will be located on the gate side 109 of the memory transistor. This insulating spacer 143 can be, in the same way as hereinabove, a nitride or an oxide/nitride bilayer. This insulating spacer 143 makes it possible to insulate the zones of silicidation 128 and 122 belonging respectively to the gate 109 of the memory transistor and to the gate 106 of the selection transistor. This insulating spacer 143 is not necessarily indispensable as the stack of layers 110 already insulates the gate 106 of the selection transistor from the gate 109 of the memory transistor. This latter configuration can occur for example if the top of the gate 109 of the memory transistor is approximately at the same level as the top of the gate 106 of the selection transistor. However, the insulating spacer 143 contributes to strengthening the insulation between the two gates.

Figure 5:
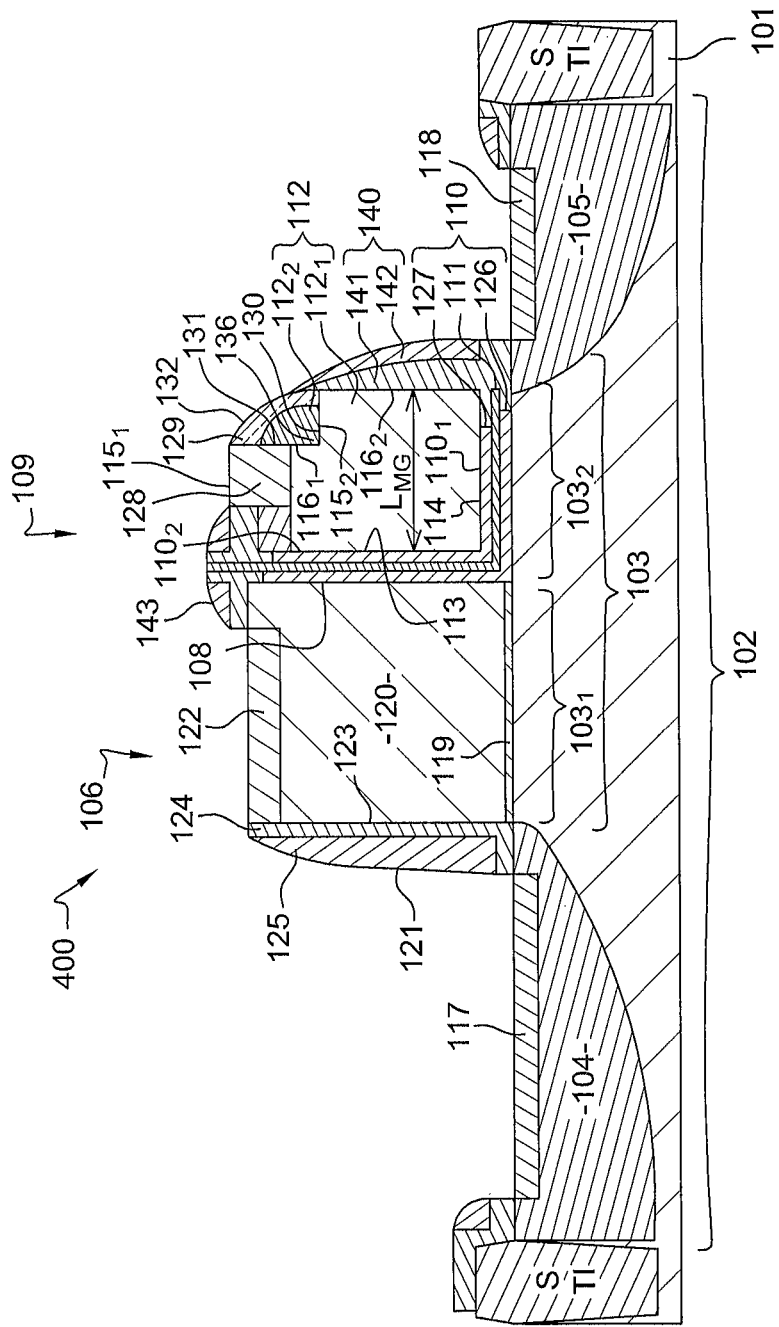
FIG. 5 shows an electronic memory cell of the NROM type with a split-gate architecture according to a second embodiment of the invention.

FIG. 5 shows an alternative 400 of the electronic memory cell of the NROM type with a split-gate architecture of FIG. 3. The cells 100 and 400 comprise the same characteristics, shown with the same references in FIG. 3 and in FIG. 5.

The cell 400 is differentiated from the cell 100 in that the curved upper face 132 of the region $112_2$ of second material and the upper face $115_1$ of the region $112_1$ of first material form a continuous surface. The curved upper face 132 of the region $112_2$ of second material provide a continuous transition between the upper face $115_1$ and the third lateral face $116_2$ of the region $112_1$ of first material. The lateral face 131 of the region $112_2$ of second material is therefore entirely in contact with the lateral face $116_1$ of the region $112_1$ of first material. According to the etching of the first material, corresponding to the zone $112_1$, the upper face $115_1$ can be higher or not as high as the gate 106 of the selection transistor.

The face $115_1$ can be at the same level as the top of the stack 110, as shown for example in FIG. 3, or lower, as shown for example in FIG. 5.

FIGS. 4a to 4k show the various steps of an example of a method of manufacturing the memory cell of FIG. 3. According to a first step 201 shown in FIG. 4a, we begin by carrying out in a substrate 300 (here a silicon substrate) insulation zones 301, for example STIs (Shallow Trench Isolation). Then, according to a method known to those skilled in the art, a first gate structure 302 is carried out, referred to as gate of the selection transistor, comprised of a dielectric gate layer 303 (carried out for example via thermal oxidation of the semiconductive zone forming the substrate) followed by a conductive layer 304 made of polysilicon. A third sacrificial dielectric layer 305, for example $SiO_2$, can be deposited on the conductive layer 304. This sacrificial layer 305 is consumed later, as such making it possible to lower the level of the first gate structure 302 and to as such minimise the risk of a short circuit between the first gate structure and the second gate structure.

The deposit of a three-layer stack 309 is then carried out, for example of oxide-nitride-oxide (referred to as ONO) formed from a first dielectric layer 306 (for example made of $SiO_2$), from a second layer 307 carried out in a material that can store electrical charges (for example comprised of $Si_3N_4$) and from a third layer 308 comprised of a dielectric material ($SiO_2$, for example). This deposit is carried out in such a way as to cover the first gate structure 302. This deposit is beneficially a conformal deposit.

Figure 4A:
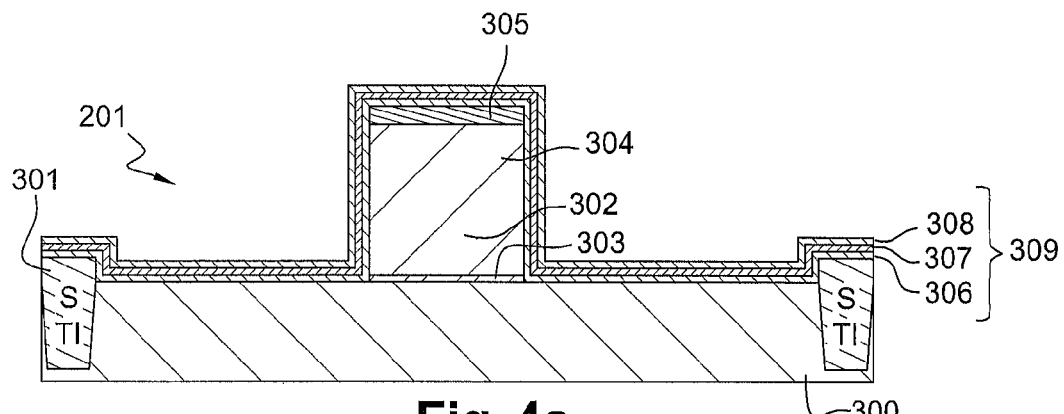
FIGS. 4a to 4k show the steps of an example of the method of manufacturing of the memory cell of FIG. 3.
Figure 4B:
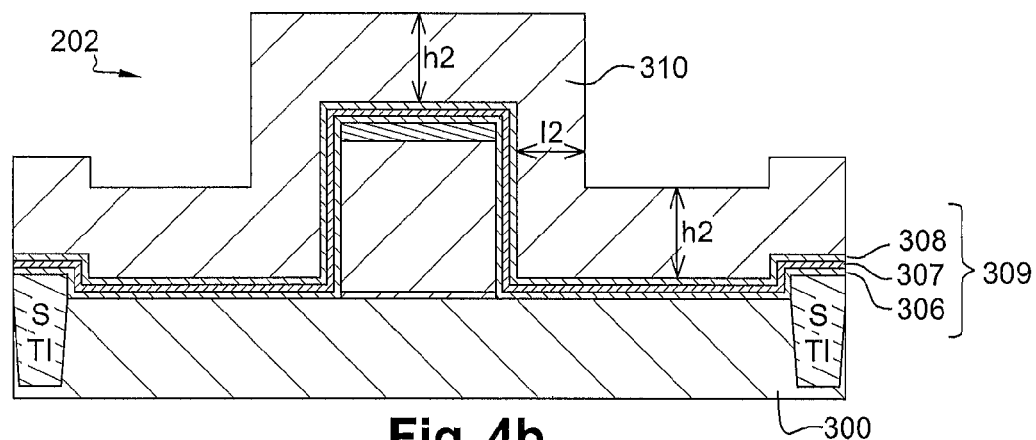

According to a second step 202 shown in FIG. 4b, a layer 310 of a first gate material of the memory transistor is deposited in such a way as to cover the stack 309 deposited hereinabove. The first material can for example be polysilicon. The deposit should be as conformal as possible. "Conformal deposit" means a deposit that covers in a constant manner the relief whereon it is deposited. In this case here, the deposit has a thickness h2 measured according to a direction perpendicular to the reference plane of the substrate, and a thickness l2 measured according to a direction perpendicular to the plan defined by the lateral flank of the second gate structure. h2 should be as close as possible to l2. For example, the ratio l2/h2 is between 0.8 and 1, and ideally 1. In order to provide for good conformity of the deposit, a low-pressure chemical vapour deposition technique can be used.

Figure 4C:
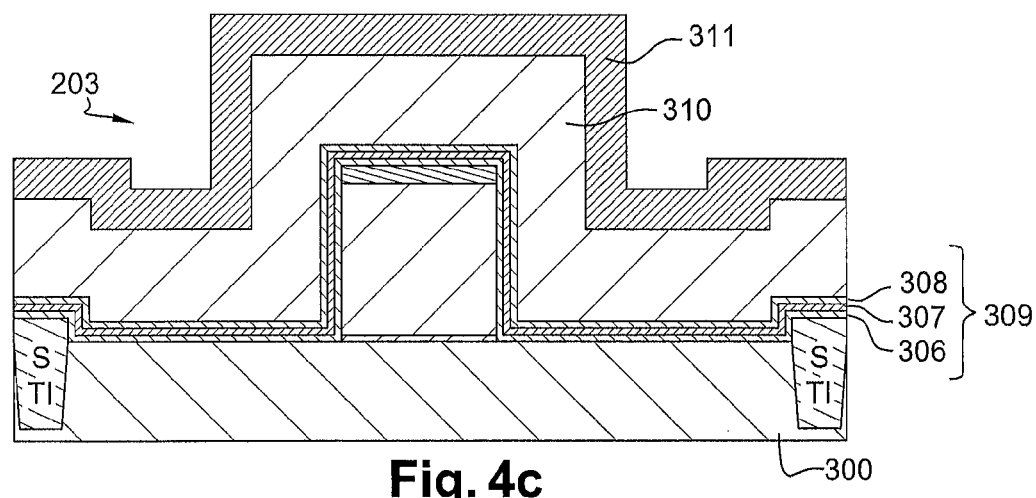
Figure 4D:
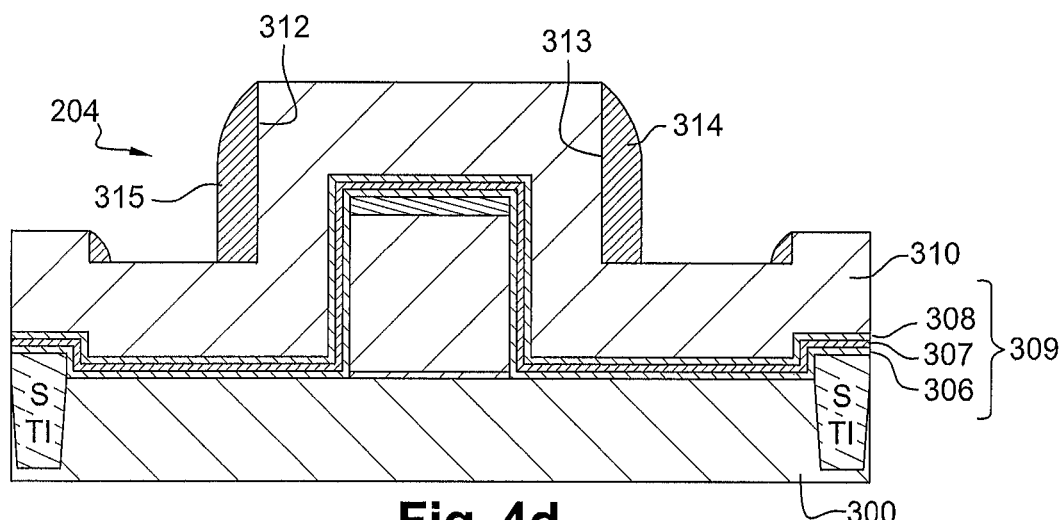
Figure 4E:
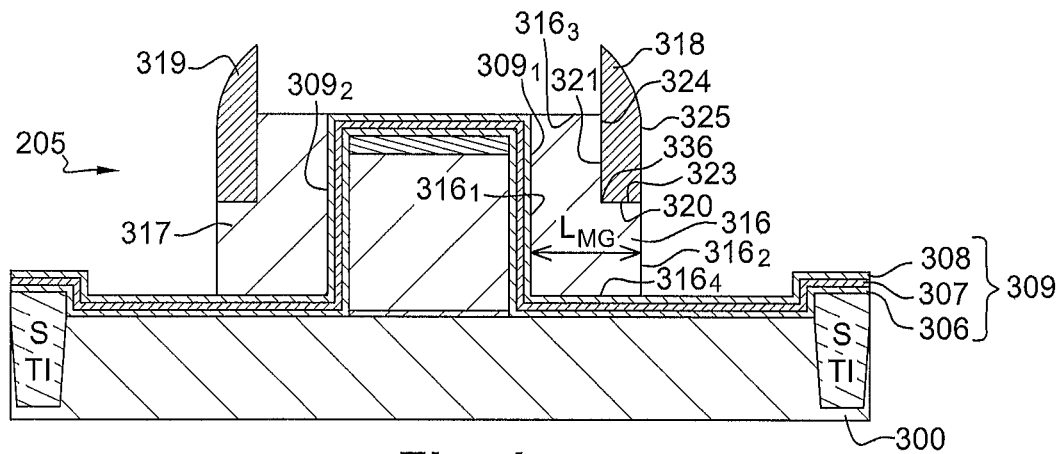

According to a third step 203 shown in FIG. 4c, a conformal deposit with a sufficient thickness of a layer 311 of a second gate material of the memory transistor is carried out. Reference will be made again as to the notion of "sufficient thickness" in the rest of the document. The first material and the second material are such that, according to the etching parameters:
 the second material can be etched selectively in relation to the first material with a ratio of etching speeds that is sufficiently high, preferably greater than or equal to 2;
 the first material can be etched selectively in relation to the second material with a ratio of etching speeds that is sufficiently high, preferably greater than or equal to 2.

"Selective etching of a first material in relation to a second material" means an etching that primarily affects this first material and that affects less the second material. The second material can for example be a material with a polysilicon-germanium polySiGe base. Before carrying out the deposit of the layer 311 of second material, the surface of the layer 310 of first material is prepared and cleaned beforehand, for example with hydrofluoric acid HF.

The layer 310 of first material has in particular a first lateral flank 312 and a second lateral flank 313. According to a fourth step 204 shown in FIG. 4d, the thickness of the layer 311 of second material is etched anisotropically, in such a way as to retain the second material covering the layer 310 of first material on its lateral flanks 312 and 313. A region 314 of second material is thus obtained covering the lateral flank 313 of the layer 310 of first material and a region 315 of second material covering the lateral flank 312 of the layer 310 of first material. The regions 314 and 315 of second material have, due to the step of anisotropic etching, a rather rounded outside profile. Such a rounded outside profile is beneficially used later to facilitate the carrying out of an electrical contact by increasing the accessible surface.

The stopping of the etching is controlled: the etching is stopped in the first material and does not consume it excessively, leading to the importance of the etching selectivity of the second material in relation to the first material. A reactive ion etching technique (RIE) can be used. The etching can be broken down into several steps, of which a first that is more anisotropic and a last that is more "chemical" (and therefore less anisotropic).

The stack 309 in particular has a first lateral flank $309_1$ and a second lateral flank $309_2$. According to a fifth step 205 shown in FIG. 4e, the thickness of the layer 310 of the first material is etched:
 in the most anisotropic manner possible so as to have the flattest surface $316_3$ possible and as such improve the carrying out of electrical contacts, and the most abrupt surface $316_2$ possible and as such control the lateral dimension and the associated memory gate length $L_{MG}$;
 selectively in relation to the second material in such a way as to control the lateral dimension and the associated memory gate length $L_{MG}$;
 selectively in relation to the stack 309, in such a way as to retain the first material covering the stack 309 on its lateral flanks $309_1$ and $309_2$. A region 316 of first material is as such obtained covering the lateral flank $309_1$ of the stack 309 and a region 317 of first material covering the lateral flank $309_2$ of the stack 309.

In practice, the selectivity of this step of etching is not total: the regions 314 and 315 of second material are then etched a little and respectively become the region 318 and the region 319. The regions 318 and 319 have a more rounded profile than the regions 314 and 315, and all the more rounded than they have been etched, facilitating the later carrying out of an electrical contact. Their dimension, i.e. their length, is somewhat modified and reduced.

The region 316 of first material is in contact with the region 318 of second material. The region 316 of first material has indeed a recess 336 that is filled by the region 318 of second material. The region 317 of first material is in contact with the region 319 of second material. The region 317 of first material has indeed a recess that is filled by the region 319 of second material. The regions 317 and 319 form a useless zone and will be eliminated during a later step. The regions 316 and 318 form however a useful zone and will be retained in what follows.

The region 316 of first material comprises:
 a face 320 substantially planar and parallel to the plane of the substrate;
 a face 321 substantially planar and perpendicular to the plane of the substrate. The face 320 and the face 321 form the recess 336.
 a first lateral face $316_1$, substantially planar and perpendicular to the plane of the substrate, in contact with the first lateral flank $309_1$ of the stack 309;

a second lateral flank 316₂, substantially planar and perpendicular to the plane of the substrate. The length $L_{MG}$ separates the second lateral face 316₂ from the first lateral face 316₁.
an upper face 316₃, substantially planar and parallel to the plane of the substrate;
a lower face 316₄, substantially planar and parallel to the plane of the substrate and in contact with the stack 309.

The region 318 of second material has:
a lower face 323 in contact with the face 320 of the recess 336 of the region 316 of first material;
a first lateral face 324 comprising at least one zone in contact with the face 321 of the recess 336 of the region 316 of first material;
an upper face 325 connecting the lower face 323 to the first lateral face 324. The upper face 325 has a curved profile and therefore less abrupt, more rounded, which makes it possible to facilitate the later carrying out of an electrical contact. The upper face 325 of the region 318 of second material forms with the second lateral face 316₂ of the region 316 of first material a substantially continuous surface.

A reactive ion etching technique (RIE) can be used during this step 205. The etching of the thickness of the layer 310 of the first material is selective in relation to the second material. "Selective etching of a first material in relation to a second material" means an etching that primarily affects this first material and which affects less the second material.

The region 318 of second material must not be excessively etched because:
The region 318 of second material is beneficially used to increase the surface of contact and facilitate the later carrying out of an electrical contact.
Moreover, the region 318 of second material is beneficially used to protect, during the step of etching of the thickness of the layer 310 of first material, the first material to which it is attached and as such makes it possible to obtain a lateral flank 316₂ of the region 316 of first material substantially perpendicular to the plane of the substrate 100.

Such a lateral flank substantially perpendicular to the plane of the substrate is very difficult or even impossible to obtain by direct etching of the first material in the absence of the second material. In the case of direct etching of the first material in the absence of the second material, the lateral flank obtained is substantially inclined, which results in an absence of control of the length $L_{MG}$ of the region 316 of first material, i.e. of the length of the gate of the memory transistor. Such a lateral flank substantially perpendicular to the plane of the substrate therefore makes it possible to control the memory gate length $L_{MG}$ and as such the electrical performance of the memory such as the programming window or the energy consumed.

Nevertheless, the region 318 of second material can be beneficially etched a little: indeed, when the region 318 of second material is etched a little, the first material is then etched immediately above the second material, which induces a decrease in the length $L_{MG}$ of the gate of the memory transistor. This therefore makes it possible to improve the electrical performance of the memory such as the programming window or the energy consumed.

Reference is made here again to the notion of "sufficient thickness" of second material deposited, mentioned during the step 203. Generally, if the second material is etched n times slower than the first material, then the thickness $h_{2g}$ of second material removed during the etching of the first material is: $h_{2g}=h_1/n$, when $h_1$ is the thickness of the first material deposited then etched, and where n is the etching selectivity between the first material and the second material. So that there remains a sufficient thickness of the second material after the etching of the first material, the thickness $h_{2d}$ deposited of the second material satisfies the following inequality: $h_{2d} \geq h_1/n$. In order to provide for a sufficient margin, the thickness $h_{2d}$ deposited of the second material may satisfy the following inequality: $h_{2d} \geq h_1/n + h_1/5$.

Figure 4F:
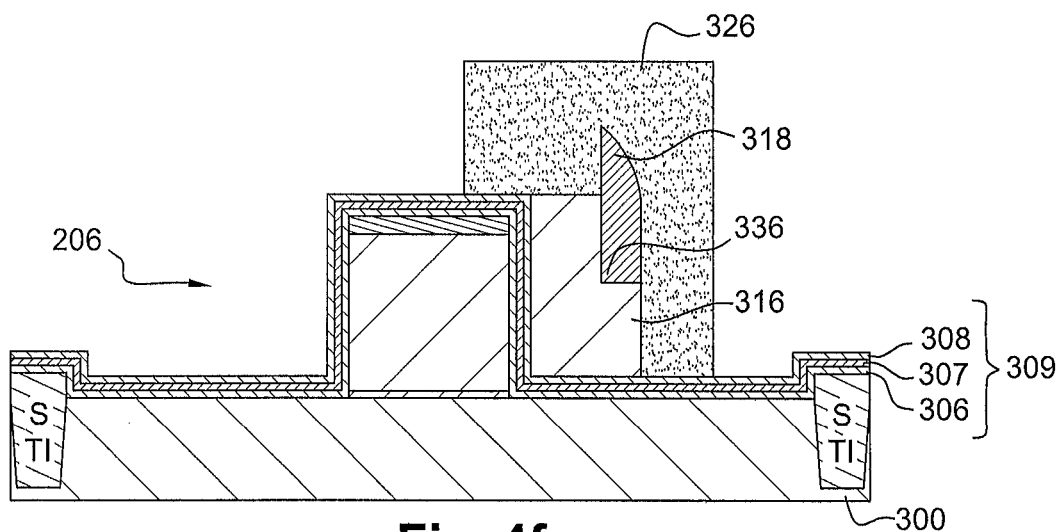

According to a sixth step 206 shown in FIG. 4f, a protective resin 326 (for example a photosensitive resin) is deposited on the useful region formed by the region 318 of second material and by the region 316 of first material. The useless region is then removed, constituted of the region 317 of first material and of the region 319 of second material, for example by means of an RIE etching. The protective resin 326 is then removed, for example with a stripping method.

Figure 4G:
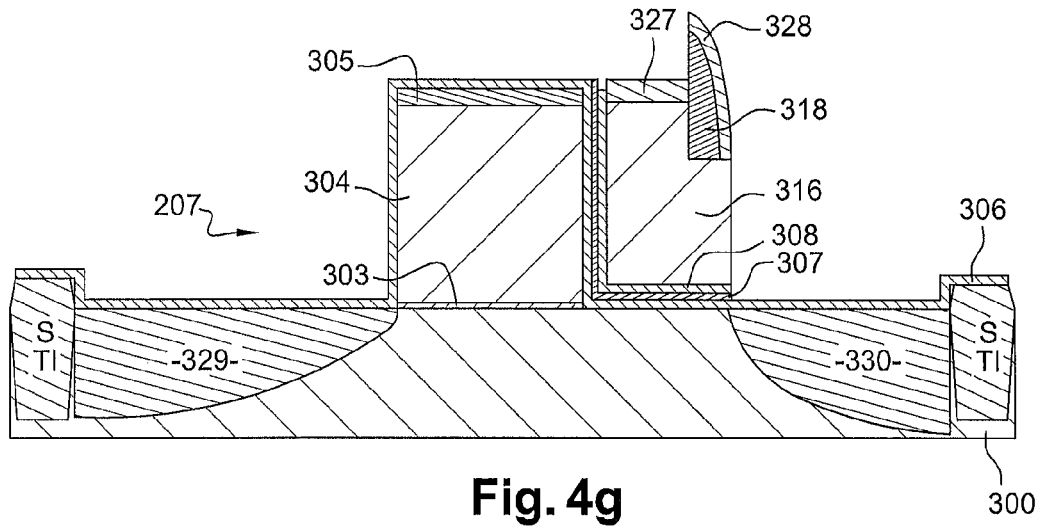

According to a seventh step 207 shown in FIG. 4g, the removal of the third layer 308 and of the second layer 307 of the non-covered stack 309 is carried out, with stoppage on the first layer 306. In the case of a stack 309 of the ONO type, this removal can be carried out by plasma anisotropic etching (dry etching) such as a reactive ion etching (RIE) with stopping on the layer of $SiO_2$ 306. The step 207 then includes a step of implantation in such a way as to start the doping of the source 330 and drain 329 extension zones. This doping is a doping of the LDD ("Low Doped Drain") type making it possible to dope at an average dose the volume 327 of the region 316, the volume 328 of the region 318 as well as the source 330 and drain 329 extension regions. According to whether the transistor that is sought to be carried out is of the PMOS or NMOS type, the ions are chosen in such a way as to carry out zones with a p or n type of conductivity. Note that for the source 330 and drain 329 extension regions, the LDD implantation is done through a portion of the layer 306 that protects the surface of the semiconductive zone of the substrate 300 to be doped and as such prevents deterioration of the surface condition of the semiconductive zone. The remaining layer 306 will in what follows be eliminated.

Figure 4H:
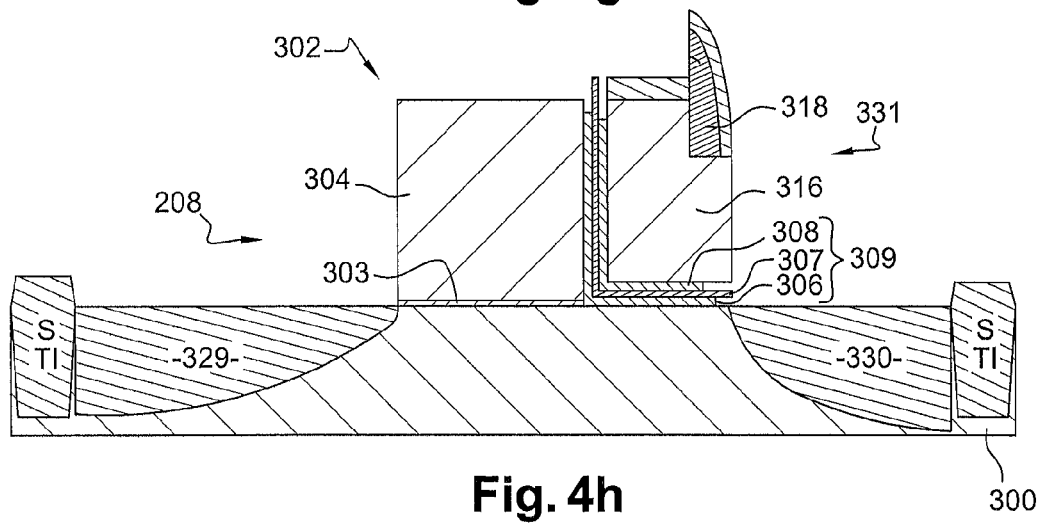

According to an eighth step 208 shown in FIG. 4h, the removal of the lower layer 306 of the ONO stack 309 is carried out. This removal is for example carried out by isotropic wet etching with a partially diluted solution of hydrofluoric acid (HF) in such a way as to have a good selectivity of the removal of $SiO_2$ in relation to substrate 100 (here a silicon substrate). The residual stack 309, the region 316 of first material and the region 318 of second material form the second gate structure 331.

When, during the step 201, a sacrificial dielectric layer 305 was deposited on the conductive layer 304 of the first gate structure 302, this layer 305 is consumed-during the step 208, making it possible as such to lower the level of the first gate structure 302 and to as such minimise the risk of a short circuit between the first gate structure and the second gate structure. The first gate structure 302 and the second gate structure 331 are already insulated from each other by the ONO stack 309. The lowering of the level of the first gate structure 302 contributes to strengthening this insulation but is not mandatory.

Figure 4I:
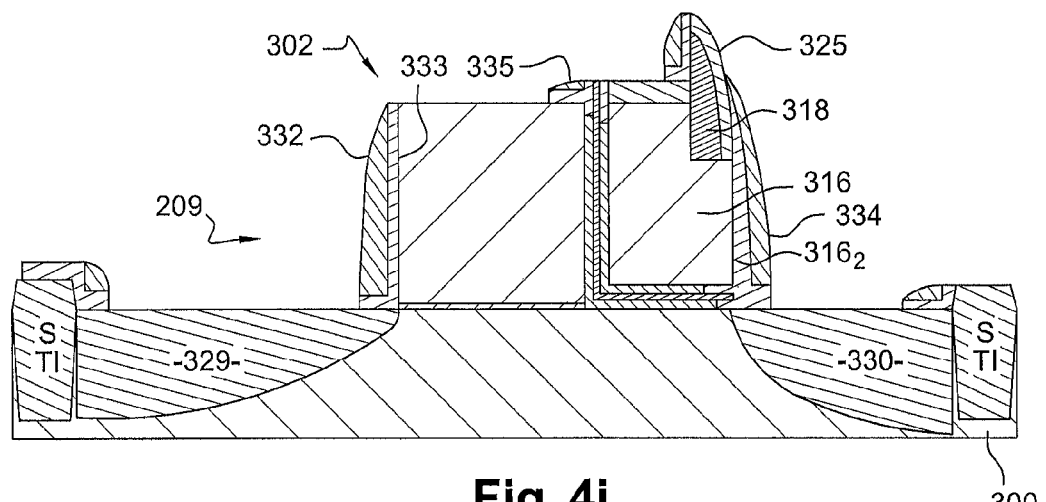

According to a ninth step 209 shown in FIG. 4i, the various insulating spacers of the memory cell are carried out, namely:
a lateral spacer 332 extending over the entire lateral flank 333 of the first gate structure 302 of the selection transistor, drain side;
an insulating spacer 334 extending over the entire lateral flank 316₂ of the region 316 and over a portion of the upper face 325 of the region 318 forming the second gate structure 331 of the memory transistor, source side;

an insulating spacer 335 extending over the entire lateral flank of the second gate structure 331 of the memory transistor, on the gate side of the selection transistor.

Each of these spacers is formed from a dielectric material, which can for example be an oxide/nitride bilayer (for example, a layer of $SiO_2$ HTO ("High Temperature Oxide") and a layer of $Si_3N_4$).

To do this, we begin by depositing a first layer of oxide referred to as HTO obtained for example by LPCVD deposit. Typically, a thickness of 10 nm is deposited. In any case, this thickness is sufficient to fill in the recesses resulting from the isotropic etching of the oxide layers of the stack of ONO layers, in the case where ONO was used to provide the memory function, intervening hereinabove. This layer allows for a good attaching of the layer of $Si_3N_4$ deposited subsequently, and also fulfils the role of a barrier layer to the etching of the $Si_3N_4$.

The depositing of another layer is then carried out, for example a layer of silicon nitride ($Si_3N_4$). This deposit can be carried out using the same technique as hereinabove, i.e. by chemical vapour deposition at a low pressure (LPCVD). A layer of silicon nitride is deposited which is typically included in a range of thicknesses ranging from 20 nm and 40 nm. This layer of silicon nitride will make it possible to form the "nitride spacers" of which the role is to "space" the implantation zones corresponding to the source/drain, as the latter could connect during the annealing that follows the implantation, in particular in the case where the gates have very small dimensions.

The spacers are obtained by etching of the RIE type. The layers of insulating material deposited beforehand are etched anisotropically while being as selective as possible in relation to the silicon substrate. The etching should be sufficient to release the upper portion of the layer on top of the zones of polysilicon; these zones can be silicidated in order to improve the electrical contact.

Figure 4J:
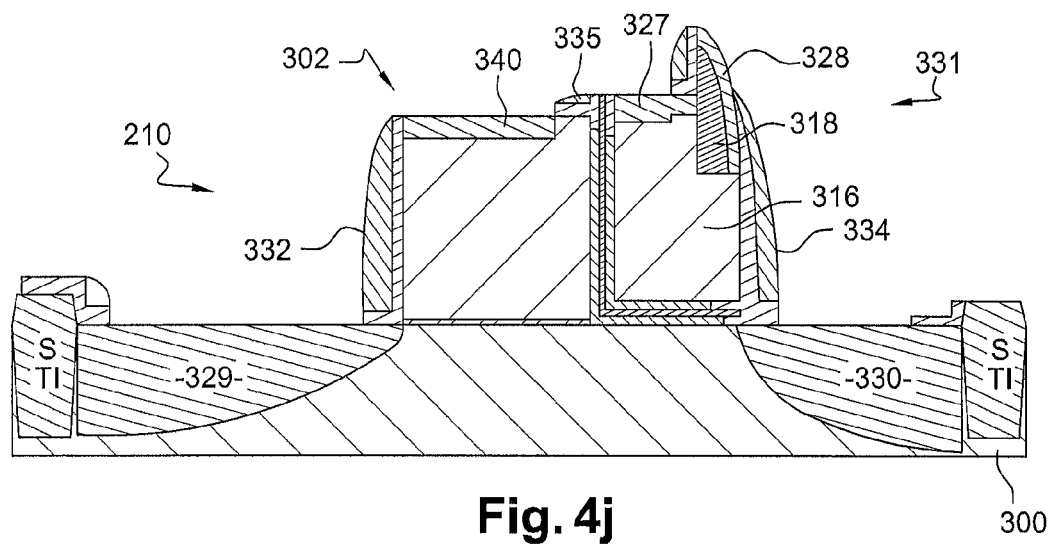

According to a tenth step 210 shown in FIG. 4j, the doping at a higher energy is carried out, approximately in the alignment of the previously manufactured spacers, of the upper face 327 of the region 316, of the upper face 328 of the region 318, of the upper face 340 of the first gate structure 302 as well as of the source 330 and drain 329 extension regions. This implantation is added to the implantation at a lower energy LDD (Low Doped Drain) which is carried out in the alignment of the gates, except for the surface 340 for which it is, in the example shown, the first doping (case where the sacrificial dielectric layer 305 was deposited on the conductive layer 304). This doping is carried out by ion implantation of the surfaces 327, 328 and 340 and of the source 330 and drain 329 extension regions. As such, in the case of carrying out a n-MOS transistor on a substrate 300 of the p type, the surfaces 327, 328 and 340 and the source 330 and drain 329 extension regions are n+ doped. In order to actuate the dopant atoms and to cure the defects due to the bombarding, an annealing implantation (also referred to as actuation annealing) is then carried out.

Figure 4K:
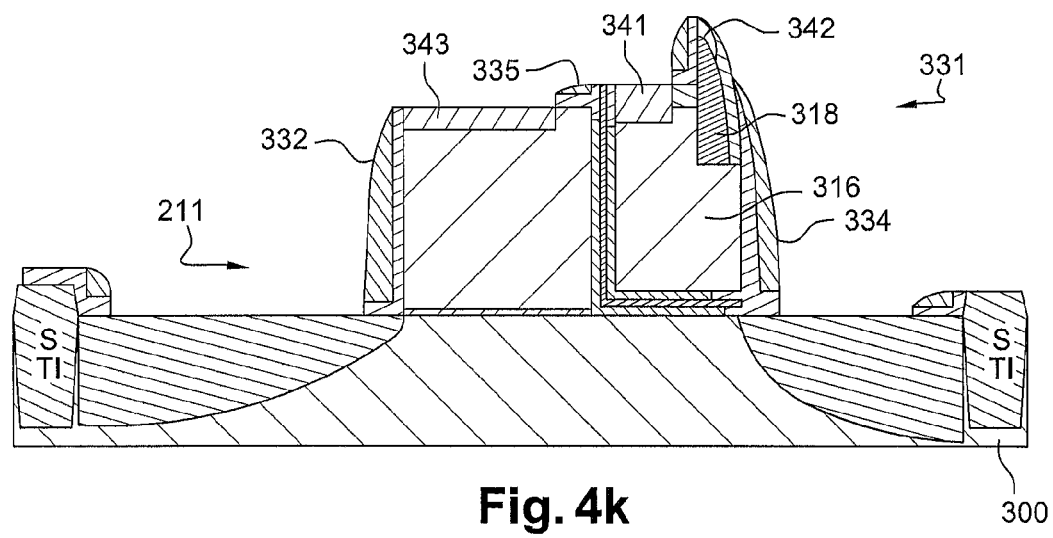

According to an eleventh step 211 shown in FIG. 4k, a step of silicidation is carried out which corresponds to the metallisation of the upper surfaces 327, 328 and 340 of the layers of polysilicon by chemical reaction between the polysilicon and a metal (nickel, for example) in such a way as to form a zone of low resistivity. A first zone of silicidation 341 of the first region 316 and a second zone of silicidation 342 of the second region 318 is as such obtained. A third zone of silicidation 343 of the first gate structure 302 is also obtained.

In order to minimise the resistance of the drain 329 and source 330 extension regions carried out in doped monocrystalline silicon, a step of silicidation of these zones is also carried out; the silicidation corresponds to the metallisation of these drain and source zones by chemical reaction between the silicon and a metal (nickel, for example) in such a way as to form zones of low resistivity.

Figure 6A:
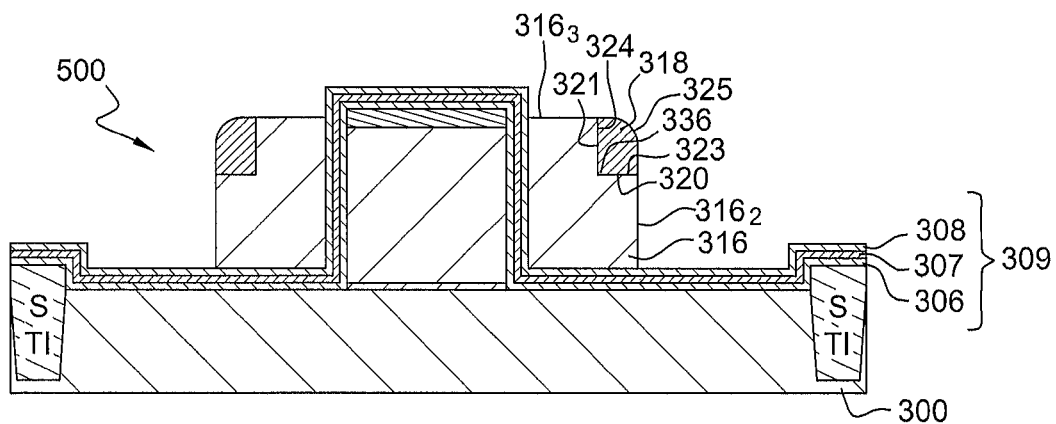
FIGS. 6a and 6b show the steps of an example of the method of manufacturing of the memory cell of FIG. 5.
Figure 6B:
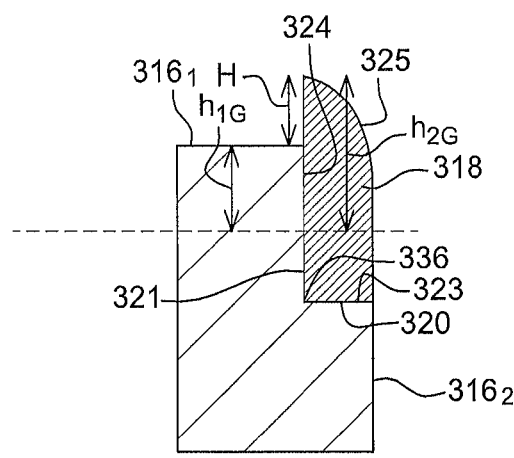

FIGS. 6a and 6b show a step 500 of an example of a method for manufacturing the memory cell of FIG. 5.

This example of a method for manufacturing the memory cell of FIG. 5 comprises the steps 201 to 205 common to the method shown in FIGS. 4a to 4e, then the step 500, shown by FIGS. 6a and 6b.

According to this step 500, the second material forming the region 318 is etched in such a way that the step difference H between the region 318 of second material and the region 316 of first material is substantially reduced to zero. The total surface of silicidation of the upper face of the regions 316 and 318 is therefore increased, which improves the later carrying out of an electrical contact. The upper face 325 of the region 318 of second material provides a continuous transition, without recess, between the upper face $316_3$ and the second lateral face $316_2$ of the region 316 of first material.

To do this, the thickness $h_{2G}$ of second material etched during this step 500 is such that: $h_{2G}=H+h_{1G}$, where H is the step difference between the region 318 and the region 316 and where $h_{1G}$ is the thickness of first material etched during the step 500. However, $v_1=h_{1G}/t_{etching}$ and $v_2=h_{2G}/t_{etching}$, where $v_1$ is the etching speed of the first material, $v_2$ is the etching speed of the second material and where $t_{etching}$ is the etching time of the step 500. Therefore: $v_2*t_{etching}=H+v_1*t_{etching}$. If there are the etching conditions where $v_2=n*v_1$, n being the etching selectivity between the first material and the second material, i.e. the etching is n times faster for the second material than for the first material, the following is obtained: $n*v_1*t_{etching}=H+v_1*t_{etching}$ therefore $t_{etching}=H/[v_1*(n-1)]$. In the particular case where n=2, the following is obtained: $t_{etching}=H/V_1$. According to the etching chemistries used and therefore the relative etching speeds of the two materials, we can therefore achieve, by best adjusting the etching time, a configuration wherein the initial step difference H is reduced to zero.

After this step 500, this example of a method of manufacturing the memory cell of FIG. 5 comprises the steps 206 to 211 common to the method shown in FIGS. 4f to 4k.

Naturally, the invention is not limited to the embodiments described in reference to the figures and alternatives can be considered without leaving the scope of the invention.

As such, although the invention has been more particularly described in the case of a first material made of polysilicon and of a second material with a Site base, it is understood that the invention applies to other pairs of materials. More generally, a material made of polysilicon and a material made of poly-$SiGe_x$ shall be spoken of, with x varying by a few percentage points at 50%, with the first material able to be either polysilicon, or poly-$SiGe_x$. Two conditions are required:

be able to carry out a deposit of the second material on the first material, which means having a good surface condition before the depositing of the second material and having a mesh parameter of the second material that is compatible with the mesh parameter of the first material;

have etching speeds of the two materials that are sufficiently different, for example a factor of 2.

The invention has been more specifically described in the case of a stack of the ONO type but the invention also applies to any type of discrete trap memory layer on split-gate architecture, with the electrons able to be stored in a layer of nitride (ONO) but also in a layer made of nanocrystals.

Likewise, the embodiments described related to dielectric gate layers of the $SiO_2$ or $SiO_2$ HTO type but it is understood that other types of dielectrics can be used, for example dielectrics of the "high-k" type such as $Al_2O_3$ in contact with the conductive region of the memory gate or a combination of $SiO_2$ layers and of high K materials. High-k material or dielectric material with a high dielectric constant means a material having a dielectric constant k that is strictly greater than 3.9 (dielectric constant of the silicon dioxide). In particular in the case of a use of a high-k dielectric material, it is also possible to replace the conductive material made of polysilicon of the conductive gate zones with metal materials or a combination of metal materials and polysilicon, such as TiN or Si, in order to decrease the output work.

The invention claimed is:

1. A method for manufacturing an electronic memory cell comprising:
   a substrate;
   a first gate structure deposited on the substrate;
   a stack comprising a plurality of layers and of which at least one of said layers is able to store electrical charges, said stack covering at least a lateral flank of the first gate structure and a portion of the substrate;
   a second gate structure insulated from the first gate structure and from the substrate by the stack;
   said method comprising forming the second gate structure by:
   depositing a layer of a first material of the second gate structure at least on a zone covered by the stack;
   depositing a layer of a second material of the second gate structure at least on a zone covered by the layer of the first material, said second material able to be etched selectively in relation to said first material and said first material able to be etched selectively in relation to said second material;
   etching the thickness of the layer of second material selectively in relation to the first material in such a way as to retain a portion of the second material laterally covering the first material;
   etching the thickness of the layer of the first material selectively in relation to the second material in such a way as to retain the portion of the first material laterally covering the stack, with the second gate structure comprising as such said portion of the first material laterally covering the stack, and which forms a first region, and at least one portion of said portion of the second material laterally covering the first material, and which forms a second region;
   performing a silicidation of a first zone extending over said first region of the second gate structure, and of a second zone extending over said second region of the second gate structure.

2. The method according to claim 1, wherein the first material has an upper face and the second material has an upper face, wherein the forming of the second gate structure further comprises, after the etching of the thickness of the layer of the first material:
   etching the second material selectively in relation to the first material in such a way that the upper face of the second material and the upper face of the first material are aligned.

3. The method according to claim 1, wherein the first material is polysilicon and the second material is polysilicon-germanium poly-$SiGe_x$.

4. The method according to claim 1, wherein the first material is polysilicon-germanium poly-$SiGe_x$ and the second material is polysilicon.

5. The method according to claim 4, wherein the first material is, prior to the depositing of the layer of the second material of the second gate structure, cleaned with hydrofluoric acid HF.

6. The method according to claim 1, wherein at least one of said depositing of the first material and depositing of the second material is a conformal deposit.

7. The method according to claim 1, wherein the depositing of the layer of the first material is by chemical vapour deposition carried out at sub-atmospheric pressure.

8. The method according to claim 1, wherein the etching of the thickness of the layer of the second material and/or the etching of the thickness of the layer of the first material is a reactive ion etching.

9. The method according to claim 1, wherein the thickness $h_{2D}$ of the layer of second material deposited during the depositing is such that: $h_{2D} \geq h_1/n$; $h_1$ being the thickness of the layer of the first material deposited during the depositing; the first material being etched n times faster than the second material.

10. The method according to claim 9, wherein the thickness $h_{2D}$ of the layer of the second material deposited during the depositing is such that: $h_{2D} \geq h_1/n + h_1/5$; $h_1$ being the thickness of the layer of the first material deposited during the depositing; the first material being etched n times faster than the second material.

* * * * *